(12) United States Patent  
Chen et al.

(10) Patent No.: US 8,053,667 B2
(45) Date of Patent: Nov. 8, 2011

(54) HOUSING OF QUAD SMALL FORM-FACTOR PLUGGABLE TRANSCEIVER MODULE

(75) Inventors: Chun-Hua Chen, Chung Ho (TW); Chun-Hsu Chen, Chung Ho (TW)

(73) Assignee: Jess-Link Products Co., Ltd., Chung Ho (TW)

( * ) Notice: Subject to any disclaimer, the term of this patent is extended or adjusted under 35 U.S.C. 154(b) by 668 days.

(21) Appl. No.: 12/178,237

(22) Filed: Jul. 23, 2008

(65) Prior Publication Data

US 2010/0018738 A1 Jan. 28, 2010

(51) Int. Cl.
*H02G 3/08* (2006.01)

(52) U.S. Cl. .............. 174/50; 174/51; 439/535; 439/95; 361/800

(58) Field of Classification Search .............. 174/50, 174/51, 6; 361/753, 800; 439/535, 92, 98, 439/95; 220/4.02

See application file for complete search history.

(56) References Cited

U.S. PATENT DOCUMENTS

| 4,308,953 | A  | * | 1/1982 | Cohen | 206/708 |
| 7,583,510 | B2 | * | 9/2009 | Wang  | 361/753 |
| 7,869,224 | B1 | * | 1/2011 | Yang  | 361/800 |

* cited by examiner

*Primary Examiner* — Dhirubhai R Patel
(74) *Attorney, Agent, or Firm* — C. G. Mersereau; Nikolai & Mersereau, P.A.

(57) ABSTRACT

A housing of a Quad Small Form-Factor Pluggable transceiver module includes a metallic casing and a plurality of elastic grounding assemblies. The metallic casing has a lower casing, a plurality of partitions and an upper casing. The lower casing is connected to the upper casing. The partitions are provided between the lower casing and the upper casing at intervals, thereby separating the interior of the metallic casing into a plurality of accommodating spaces. The accommodating spaces each receives a connector of a transceiver module, thereby forming a plurality of ports. Thus, the connectors of the transceiver modules share the common housing, thereby reducing the occupied space on the circuit board and increasing the number of the transceiver modules arranged on the circuit board.

13 Claims, 4 Drawing Sheets

HOUSING OF QUAD SMALL FORM-FACTOR PLUGGABLE TRANSCEIVER MODULE

BACKGROUND OF THE INVENTION

1. Field of the Invention

The present invention relates to a housing, and in particular to a housing of a Quad Small Form-Factor Pluggable transceiver module.

2. Description of Related Art

The conventional transceiver module can be used to provide a two-way data transmission between an electrical interface and an optical network. The transceiver module receives optical encoded signals, converts them into optical signals and transmits these optical signals to the optical network. The transceiver module also receives optical encoded signals, converts them into electrical signals, and transmits these electrical signals to the electrical interface.

Quad Small Form-Factor Pluggable (referred to as "QSFP" hereinafter) transceiver module has four independent full duplex channels. The object of such a transceiver module is to replace a single-channel SFP with a high-density optical module. The transceiver module connector can be connected to a metallic casing that is mounted on a circuit board. The metallic casing is capable of eliminating the accumulation of electrostatic charges, shielding electromagnetic interference, and protecting the connector.

However, in the conventional QSFP transceiver module, the metallic casing and the connector are both designed to have only one port. As a result, if a plurality of ports is needed, it is necessary to arrange a plurality of metallic casings and connectors on the circuit board, which occupies more space on the circuit board and thus reduces the number of transceiver modules arranged on the circuit board.

Consequently, because of the above limitation resulting from the technical design of prior art, the inventor strives via real world experience and academic research to develop the present invention, which can effectively improve the limitations described above.

SUMMARY OF THE INVENTION

The object of the present invention is to provide a housing of a QSFP transceiver module, in which a plurality of ports is provided, so that the connectors of transceiver modules share the common housing, thereby reducing the occupied space on the circuit board and increasing the number of transceiver module arranged on the circuit board.

In order to achieve the above objects, the present invention provides a housing of a QSFP transceiver module, which includes: a metallic casing having a lower casing, a plurality of partitions and an upper casing, the lower casing being connected to the upper casing, the partitions being provided between the lower casing and the upper casing at intervals, thereby separating the interior of the metallic casing into a plurality of accommodating spaces; and a plurality of elastic grounding assemblies, the elastic grounding assemblies being arranged on the metallic casing.

The present invention has advantageous features as follows. The interior of the metallic casing is separated by a plurality of partitions into a plurality of accommodating spaces. Each of the accommodating spaces receives therein a connector for the transceiver module, thereby forming a plurality of ports. Thus, the connectors for the transceiver modules share the common housing, thereby reducing the occupied space on the circuit board and thus increasing the number of transceiver modules arranged on the circuit board.

Furthermore, the present invention is provided with hooks on upper edges of the partitions, and the upper casing is provided with hooking holes. The forward-and-rearward movement of the upper casing with respect to the partitions makes the upper edges of the partitions to be fixed to the upper casing, so that the partitions and the upper casing can be assembled more easily.

Furthermore, the elastic grounding assemblies of the present invention are engaged in positioning holes of the metallic casing by means of double barbs. In this way, the elastic grounding assemblies can be firmly connected to the metallic casing without loosening.

In order to further understand the characteristics and technical contents of the present invention, a detailed description relating thereto will be made with reference to the accompanying drawings. However, the drawings are illustrative only, but not used to limit the scope of the present invention.

DETAILED DESCRIPTION OF THE PREFERRED EMBODIMENTS

Figure 1:
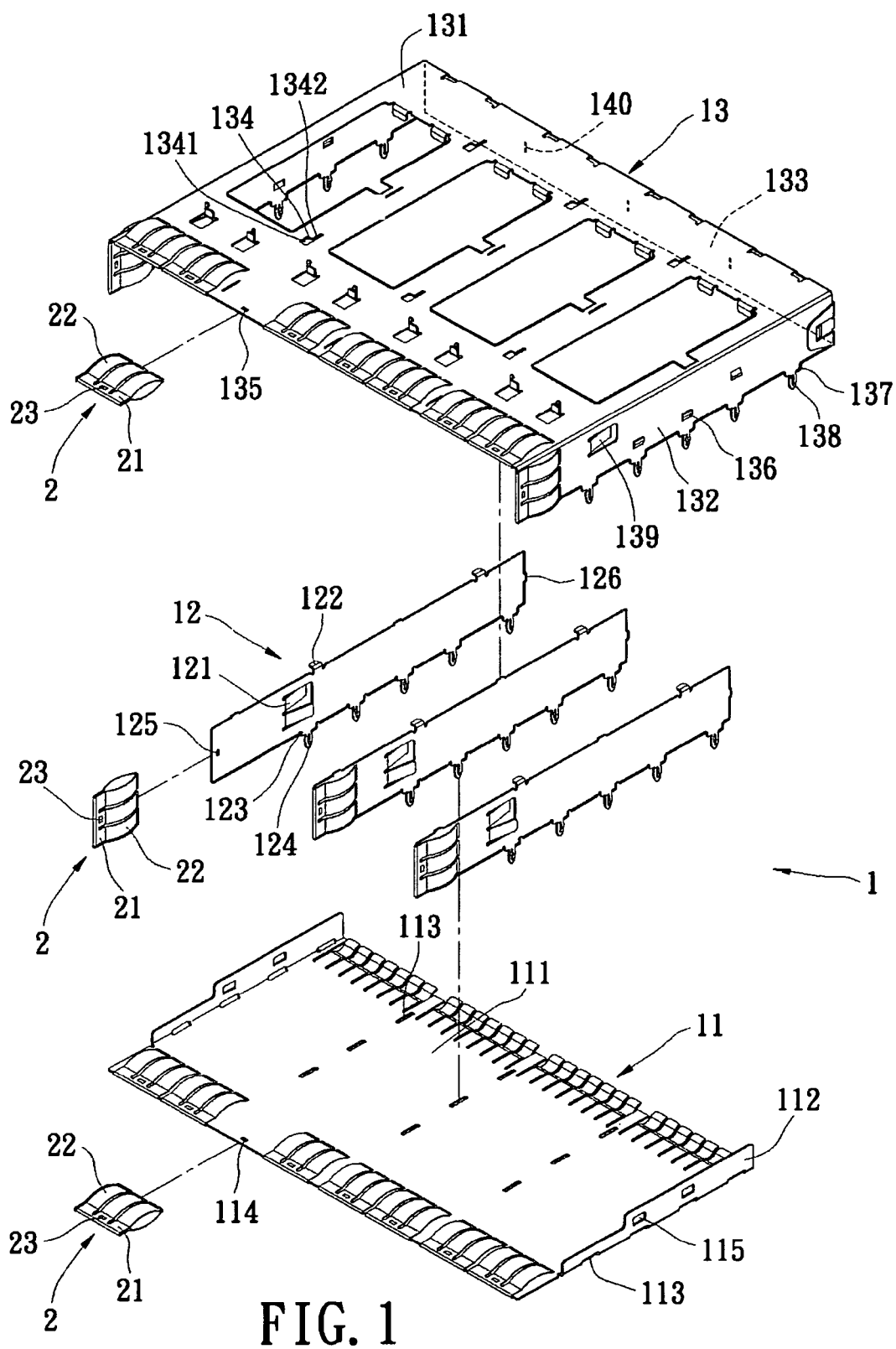
FIG. 1 is an exploded perspective view showing the housing of the transceiver module of the present invention.
Figure 2:
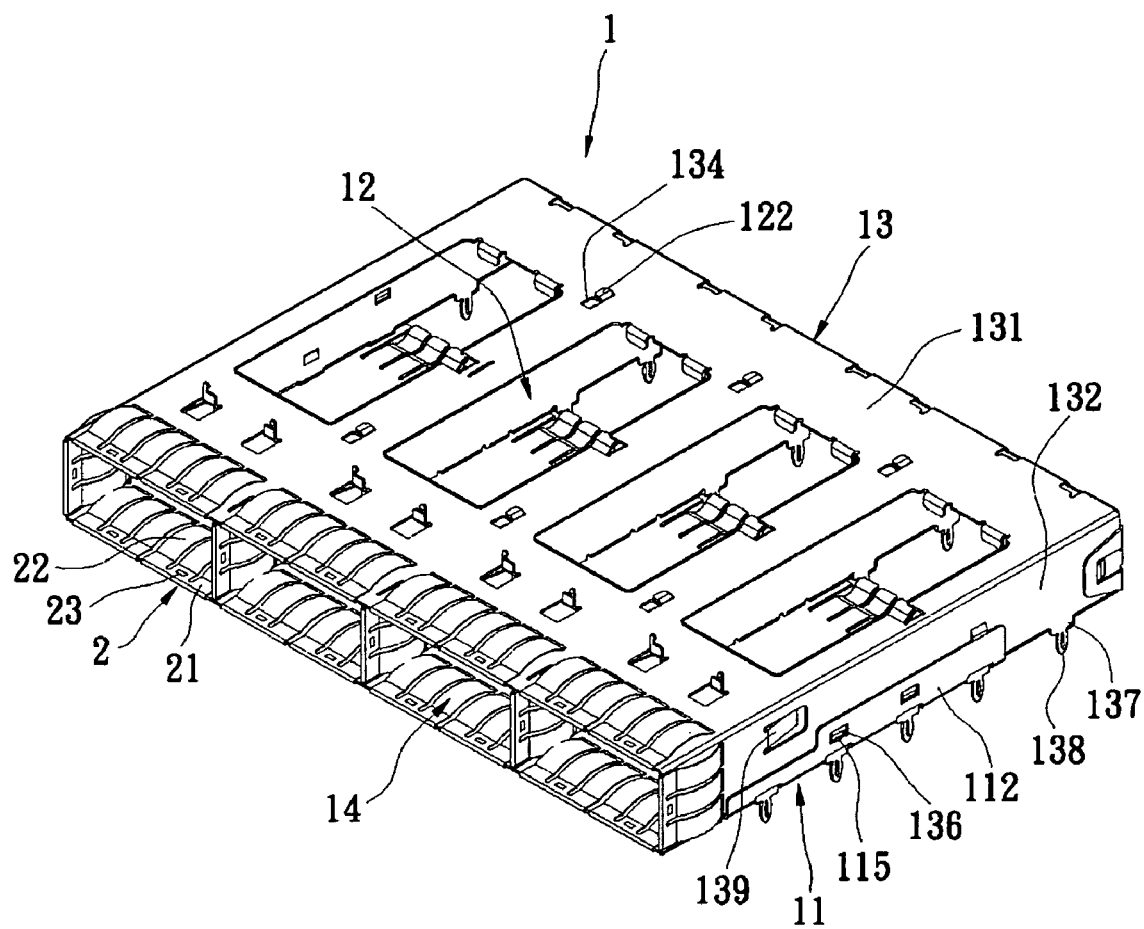
FIG. 2 is a perspective view showing the housing of the transceiver module of the present invention.
Figure 3:
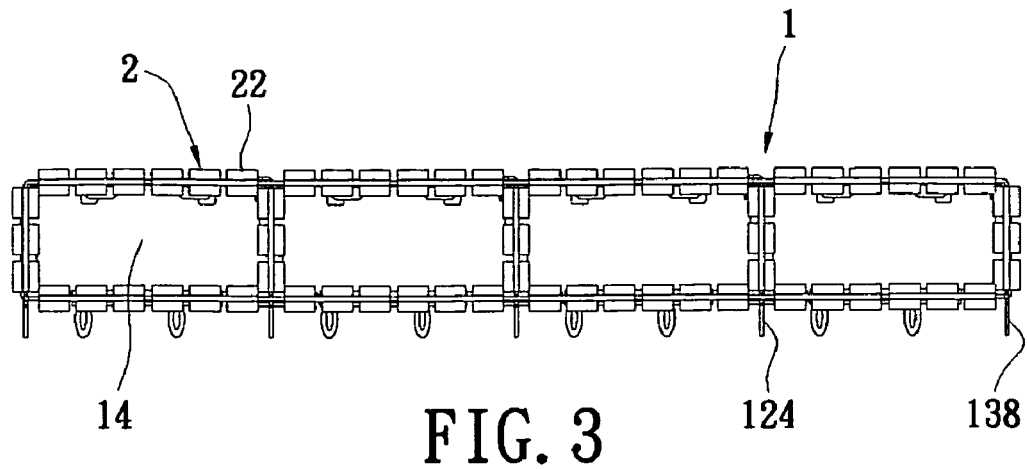
FIG. 3 is a front view showing the housing of the transceiver module of the present invention.
Figure 4:
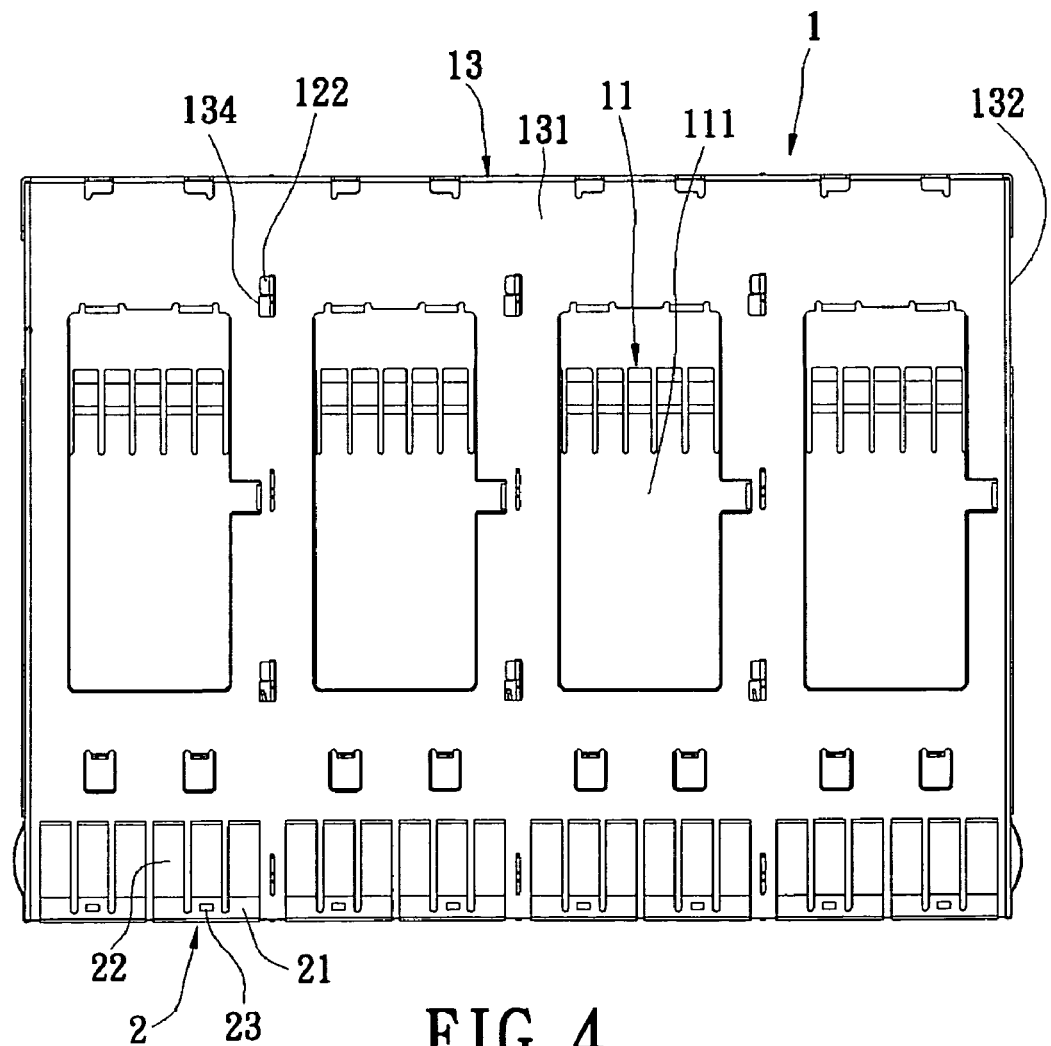
FIG. 4 is a top view showing the housing of the transceiver module of the present invention.
Figure 5:
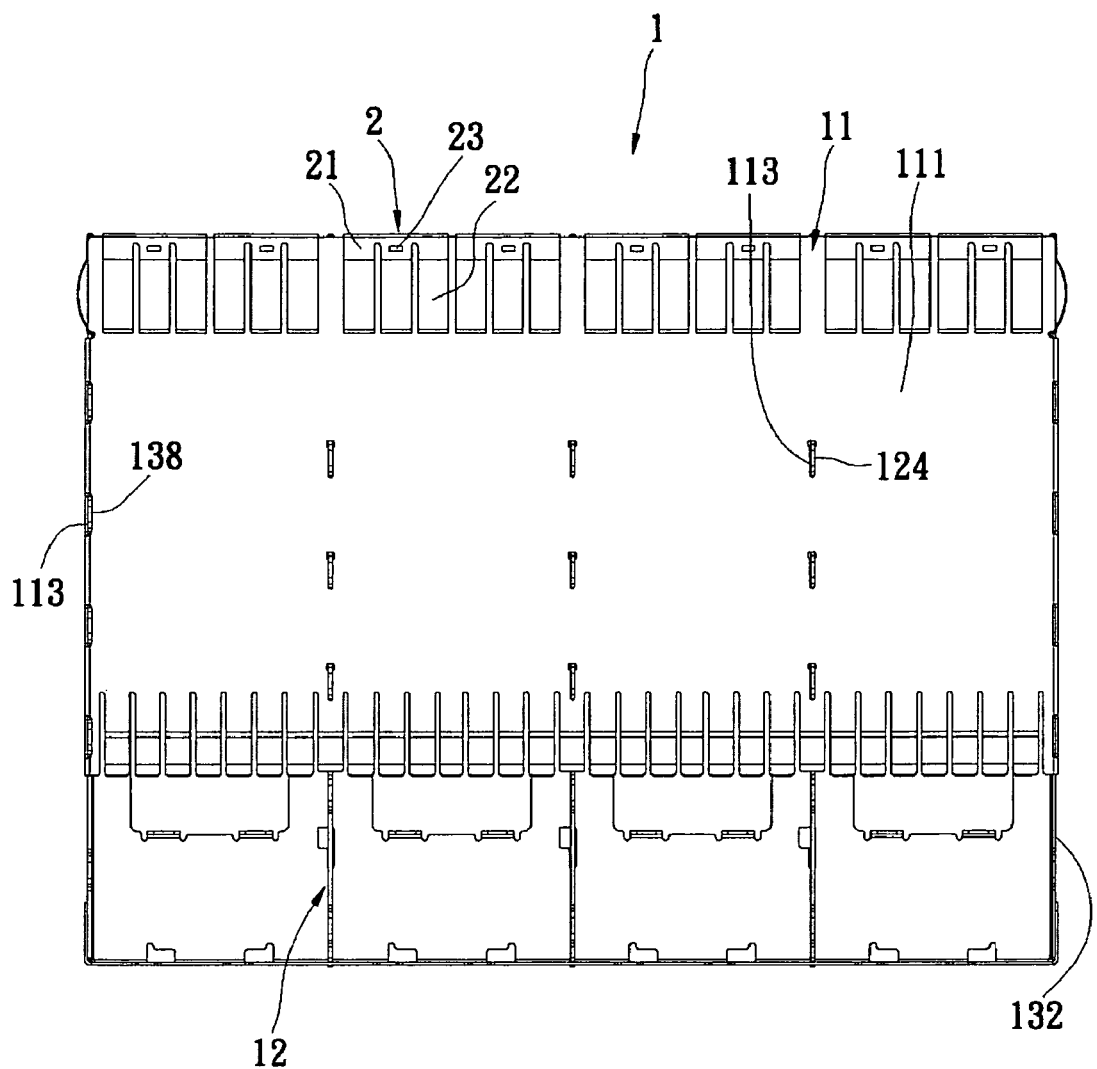
FIG. 5 is a bottom view showing the housing of the transceiver module of the present invention.

Please refer to FIGS. 1 to 5. The present invention provides a housing of a QSFP transceiver module, which includes a metallic casing 1 and a plurality of elastic grounding clips 2 (hereinafter referred to as the elastic grounding assemblies 2). The metallic casing 1 includes a hollow body and a plurality of partitioning structures 12 (hereinafter referred to as the partitions 12). The hollow body comprises a lower casing 11 and an upper casing 13 correspondingly mated to each other. The hollow body has an entrance formed on one surface thereof. The partitioning structures 12 are arranged in the hollow body in connection with the upper casing 13 and the lower casing 12, and the partitioning structures 12 are arranged in substantially parallel to each other at a predetermined interval. The partitioning structures 12 divide the entrance of the hollow body into a plurality of sub-entrances. The elastic grounding clips 2 clamped on the edge around the sub-entrances of the metallic casing 1. The lower casing 11 is made of a metallic material. The lower casing 11 has a bottom plate 111. The bottom plate 111 is formed into a rectangular metallic plate. Two opposite sides of the bottom plate 111 extend upwards to form a first side plate 112 respectively. The bottom plate 111 is provided thereon with a plurality of rows of fixing holes 113. In the present embodiment, three rows of fixing holes 113 are provided for fixing three partitions 12. The bottom plate 111 is provided thereon with a plurality of positioning holes 114 adjacent to its front end. The two first side plates 112 are provided thereon with a plurality of engaging holes 115. The connecting portions between the two first side plates 112 and the bottom plate 111 are further provided with two rows of fixing holes 113.

The partitions 12 are made of metallic materials. The partitions 12 are formed into rectangular metallic plates respectively. Each of the partitions 12 is provided with two elastic pieces 121. The two elastic pieces 121 protrude from both sides of the partition 12 respectively, thereby abutting against a docking connector inserted in the metallic casing 1. The upper edge of each partition 12 is provided with a plurality of hooks 122 that are bent to have a L shape. The lower edge of each partition 12 is provided with a plurality of protrusions 123 and pins 124 extending downwards from the lower edges of the protrusions 123. The protrusions 123 and the pins 124 correspond to the fixing holes 113. Each partition 12 is provided with a positioning hole 125 adjacent to its front end. The rear end of each partition 12 protrudes to form an insertion piece 126.

The partitions 12 stand on the lower casing 11 at intervals. The pins 124 on the lower edges of the partitions 12 pass through the corresponding fixing holes 113, so that the pins 124 extend beyond the bottom of the lower casing 11 so as to be inserted into the circuit board. The protrusions 123 on the lower edges of the partitions 12 match with the corresponding fixing holes 113, so that the partitions 12 can be positioned on the lower casing 11.

The upper casing 13 is made of a metallic material. The upper casing 13 has a top plate 131. The top plate 131 is formed into a rectangular metallic plate. Two opposite sides of the top plate 131 extend downwards to form a second side plate 132 respectively. The rear end of the top plate 131 extends downwards to form a rear plate 133. The top plate 131 is provided thereon with a plurality of rows of hooking holes 134. In the present embodiment, three rows of hooking holes 134 are provided for connecting three partitions 12. Each hooking hole 134 is formed with a first hole 1341 and a second hole 1342. The width of the second hole 1342 is smaller than that of the first hole 1341. The hooking holes 134 correspond to the hooks 122. The top plate 131 and the two second side plates 132 are provided thereon with a plurality of positioning holes 135 adjacent to their front ends.

The two second side plates 132 are provided thereon with a plurality of engaging pieces 136. The engaging pieces 136 protrude outside the second side plate 132 and correspond to the engaging holes 115. The lower edges of the two second side plates 132 are provided with a plurality of protrusions 137 and pins 138 extending downwards from the lower edges of the protrusions 137. The protrusions 137 and the pins 138 correspond to the fixing holes 113 that are located at the connecting portions between the two first side plates 112 and the bottom plate 111. The two second side plates 132 are each provided with an elastic piece 139. The elastic piece 139 protrudes inside the second side plate 132 to abut against the docking connector inserted into the metallic casing 1. The rear plate 133 is provided thereon with a plurality of insertion holes 140. The insertion holes 140 correspond to the insertion pieces 126. The engaging pieces 136 are engaged with the engaging holes 115, so that the upper casing 13 can be connected to the lower casing 11, thereby forming a hollow housing. The pins 138 on the lower edges of the two second side plates 132 pass through the corresponding fixing holes 113, so that the pins 138 can extend beyond the bottom of the lower casing 11 so as to be inserted into the circuit board. The protrusions 137 on the lower edges of the two second side plates 132 match with the corresponding fixing holes 113. The hooks on the upper edges of the partitions 12 pass upwardly through the first holes 1341 of the corresponding hooking holes 134, thereby moving the upper casing 13 forwards and backwards with respect to the partitions 12. In this way, the hooks 122 on the upper edges of the partitions 12 slide into the second holes 1342 of the hooking holes 134, thereby fixing the upper edges of the partitions 12 to the upper casing 13. As a result, the insertion pieces 126 on the rear ends of the partitions 12 can be inserted into the corresponding insertion holes 140, so that the partitions 12 can be combined with the upper casing 13 to form one body.

The elastic grounding assemblies 2 are each made of metallic materials. Each of the elastic grounding assemblies 2 has a clamping portion 21 and a plurality of elastic grounding pieces 22 connected to the clamping portion 21. The clamping portion 21 is bent to form a U-shaped piece. Two opposite sides of the clamping portion 21 are each provided with at least one barb 23. The barbs 23 extend into the clamping portion 21, so that the clamping portion 21 of the elastic grounding assembly 2 can form a double-barb structure. The elastic grounding pieces 22 are formed by extending from both ends of the clamping portion 21.

The elastic grounding assemblies 2 clamp the front ends of the lower casing 11, the partitions 12 and the upper casing 13 of the metallic casing 1 with their clamping portions 21. The barbs 23 of the elastic grounding assemblies 2 are engaged in the corresponding positioning holes 114, 125 and 135, so that the elastic grounding assemblies 2 can be arranged on the metallic casing 1 firmly.

According to the present invention, the interior of the metallic casing 1 is provided with a plurality of partitions 12. The partitions 12 are arranged between the lower casing 11 and the upper casing 13. The interior of the metallic casing 1 is separated by the partitions 12 into a plurality of accommodating spaces 14 (four in the present embodiment). Each of the accommodating spaces 14 can receive a connector of a transceiver module, thereby forming a plurality of ports (four-port construction). Thus, a plurality of docking connectors can be inserted in these ports.

When the docking connector is inserted into the accommodating space 14, it is electrically connected with the connector of the transceiver module. Further, the elastic grounding pieces 22 of the elastic grounding assemblies 2 make the metallic casing of the docking connector to be grounded, so that the metallic casing 1 can be used to eliminate the accumulation of electrostatic charges, shield electromagnetic interference and protect the connector.

The housing of the present invention is designed to have a plurality of ports (four ports), so that the connector of the transceiver module shares the common housing, thereby reducing the occupied space on the circuit board and increasing the number of transceiver modules arranged on the circuit board.

Furthermore, in the present invention, the upper edges of the partitions 12 are provided with hooks 122, and the upper casing 13 is provided with hooking holes 134. The forward-and-rearward movement of the upper casing 13 with respect to the partitions 12 makes the upper edges of the partitions 12 to be engaged with the upper casing 13, so that the partitions 12 and the upper casing 13 can be assembled more easily.

Furthermore, in the present invention, the elastic grounding assemblies 2 are engaged with the positioning holes 114, 125 and 135 by means of double barbs 23, so that the elastic grounding assemblies 2 can be firmly connected to the metallic casing 1 without loosening.

While the present invention has been described in terms of what is presently considered to be the most practical and preferred embodiments, it is to be understood that the present invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A housing of a quad small form-factor pluggable transceiver module, comprising:
a metallic casing including a substantially rectangular hollow body and a plurality of partitioning structures,
wherein the hollow body comprises an upper casing and a lower casing correspondingly mated to each other,
wherein the hollow body has an entrance formed on a surface thereof,
wherein the partitioning structures are arranged in the hollow body in connection with the upper casing and the lower casing, and the partitioning structures are arranged substantially parallel to each other at a predetermined interval,
wherein the partitioning structures divide the entrance of the hollow body into a plurality of sub-entrances; and
a plurality of elastic grounding clips clampingly disposed on the edge around the sub-entrances of the metallic casing.

2. The housing of a quad small form-factor pluggable transceiver module according to claim 1, wherein the lower casing has a bottom plate portion and a pair of first lateral portions upwardly extending from two opposing sides of the bottom plate portion, wherein the upper casing has a top plate portion, a pair of second lateral portions downwardly extending from two opposing sides of the top plate portion, and a rear end portion opposing the entrance extending downward from the top plate portion.

3. The housing of a quad small form-factor pluggable transceiver module according to claim 2, wherein the bottom plate portion and the connecting portions between the two first lateral portions and the bottom plate portion are provided with a plurality of fixing holes, the partitioning structures and the lower edges of the two second lateral portions are provided with protrusions and pins extending downwards from the lower edges of the protrusions, whereby the pins on the partitioning structures and the lower edges of the two second lateral portions pass through the corresponding fixing holes, so that the pins extend beyond the bottom of the lower casing and the protusions on the partitioning structures and the lower edges of the two second lateral portions match with the corresponding fixing holes.

4. The housing of a quad small form-factor pluggable transceiver module according to claim 2, wherein the two first lateral portions are provided with a plurality of engaging holes, the two second lateral portions are provided with a plurality of engaging pieces, and the engaging pieces are engaged with the engaging holes.

5. The housing of a quad small form-factor pluggable transceiver module according to claim 1, wherein the upper edges of the partitioning structures are provided with a plurality of hooks, the top plate portion is provided with a plurality of hooking holes, each hooking hole has a first hole and a second hole, the width of the second hole being smaller than that of the first hole, the hooks on the upper edges of the partitioning structures pass through the first holes of the corresponding hooking holes and slide into the second holes respectively, thereby fixing the upper edges of the partitioning structures to the upper casing.

6. The housing of a quad small form-factor pluggable transceiver module according to claim 5, wherein the rear end portion is provided with a plurality of insertion holes, and the rear end of each partitioning structure forms an insertion piece which is inserted into the corresponding insertion hole.

7. The housing of a quad small form-factor pluggable transceiver module according to claim 1, wherein there are three partitioning structures separating the entrance of the metallic casing into four sub-entrances.

8. The housing of a quad small form-factor pluggable transceiver module according to claim 1, wherein each of the elastic grounding clips has a clamping portion and a plurality of elastic grounding pieces connected to the clamping portion, each of both sides of the clamping portion is provided with at least one barb, the barbs extend into the clamping portion, the clamping portions of the grounding elastic piece clips clamp the front ends of the lower casing, the partitioning structures and the upper casing of the metallic casing, and the lower casing, the partitioning structures and the upper casing of the metallic casing are provided with a plurality of positioning holes, whereby the barbs of the elastic grounding clips are engaged in the corresponding positioning holes.

9. A housing of a quad small form-factor pluggable transceiver module, comprising:
a metallic casing including a substantially rectangular hollow body and a plurality of partitioning structures,
wherein the hollow body has an entrance formed on one surface thereof,
wherein the partitioning structures are arranged in the interior of the hollow body in connection with two opposing inner surfaces thereof and substantially parallel to each other at a predetermined interval,
wherein the partitioning structures divide the entrance of the hollow body into a plurality of sub-entrances; and
a plurality of elastic grounding clips clampingly disposed on the edge around the sub-entrances of the metallic casing.

10. The housing of a quad small form-factor pluggable transceiver module according to claim 9, wherein the upper edges of the partitioning structures are provided with a plurality of hooks, the metallic casing is provided with a plurality of hooking holes, each hooking hole is formed with a first hole and a second hole, the width of the second hole is smaller than that of the first hole, the hooks on the upper edges of the partitioning structures pass through the first holes of the corresponding hooking holes and slide into the second holes respectively, thereby fixing the upper edges of the partitioning structures to the upper casing.

11. The housing of a quad small form-factor pluggable transceiver module according to claim 10, wherein the metallic casing is provided with a plurality of insertion holes, and the rear end of each partitioning structure forms an insertion piece, wherein the insertion pieces on the rear ends of the partitioning structures are inserted in the corresponding insertion holes.

12. The housing of a quad small form-factor pluggable transceiver module according to claim 9, wherein there are three partitioning structures separating the entrance of the metallic casing into four sub-entrances.

13. The housing of a quad small form-factor pluggable transceiver module according to claim 9, wherein each of the elastic grounding clips has a clamping portion and a plurality of elastic grounding pieces connected to the clamping portion, both sides of the clamping portion are each provided with at least one barb, the barbs extend into the clamping portion, the clamping portions of the elastic grounding clips clamp the front ends of the metallic casing, the metallic casing are provided thereon with a plurality of positioning holes, the barbs of the elastic grounding clips are engaged in the corresponding positioning holes.

* * * * *